(12) United States Patent
Watanabe (10) Patent No.: US 7,420,489 B2
(45) Date of Patent: Sep. 2, 2008

(54) SEMICONDUCTOR-CIRCUIT-DEVICE VERIFYING METHOD AND CAD APPARATUS FOR IMPLEMENTING THE SAME

(75) Inventor: Hitoshi Watanabe, Shinjuku-ku (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/407,950

(22) Filed: Apr. 21, 2006

(65) Prior Publication Data

US 2007/0090975 A1   Apr. 26, 2007

(30) Foreign Application Priority Data

Oct. 20, 2005   (JP) ............... 2005-305438

(51) Int. Cl.
   *H03M 1/10*   (2006.01)
(52) U.S. Cl. .................... 341/120; 714/724; 703/14
(58) Field of Classification Search ............. 341/120; 703/2, 14; 714/724
   See application file for complete search history.

(56) References Cited

U.S. PATENT DOCUMENTS

| | | | | |
|---|---|---|---|---|
| 5,246,813 A | * | 9/1993 | Hoshinouchi et al. | 430/296 |
| 5,754,826 A | * | 5/1998 | Gamal et al. | 703/14 |
| 5,907,494 A | * | 5/1999 | Dangelo et al. | 703/1 |
| 6,173,426 B1 | * | 1/2001 | Sanada | 714/724 |
| 7,031,889 B1 | * | 4/2006 | McBride | 703/2 |
| 2003/0115554 A1 | * | 6/2003 | Ara et al. | 716/1 |
| 2003/0125920 A1 | * | 7/2003 | Matsuoka et al. | 703/15 |
| 2003/0195736 A1 | * | 10/2003 | Ghosh et al. | 703/14 |
| 2004/0006751 A1 | * | 1/2004 | Kawabe et al. | 716/4 |
| 2005/0015582 A1 | * | 1/2005 | Shida et al. | 713/2 |

FOREIGN PATENT DOCUMENTS

JP   2004-273476   9/2004

* cited by examiner

*Primary Examiner*—Jean B Jeanglaude
(74) *Attorney, Agent, or Firm*—Staas & Halsey LLP

(57) ABSTRACT

A verifying method and apparatus verifies operation of a semiconductor circuit device by inputting, to a logical simulator, logical models representing a logic circuit and an analog circuit, adding, to the logical model representing the analog circuit, a function that generates a function value in accordance with the state of connections between terminals of the analog circuit and terminals of the logic circuit, outputting the result of comparing the function value generated by the function and an expected value, and, based on a result of the comparison, determining whether or not there is a connection error between the terminals of the analog circuit and the terminals of the logic circuit.

8 Claims, 8 Drawing Sheets

SEMICONDUCTOR-CIRCUIT-DEVICE VERIFYING METHOD AND CAD APPARATUS FOR IMPLEMENTING THE SAME

BACKGROUND OF THE INVENTION

1. Field of the Invention

The present invention relates to terminal connection verifying methods for verifying connections between terminals of circuit blocks in semiconductor circuit devices and CAD (computer-aided design) apparatuses for implementing the terminal connection verifying methods. In particular, the present invention relates to a terminal connection verifying method for verifying connections between terminals of an analog circuit macro and terminals of a logic circuit, both circuits being included in a semiconductor circuit device, and a CAD apparatus for implementing the terminal connection verifying method.

2. Description of the Related Art

Recently, in many cases, semiconductor circuit devices include not only logic circuits but also analog signal processing circuits, that is, analog macros. The analog macros each handle an analog signal which conveys information by using the potential level of the signal, and which differs from a logic signal that conveys information on the basis of an "H (high)" or "L (low)" state of the potential level of the logic signal.

This makes it impossible for a logical simulator to accurately handle the analog signal. Thus, it is not easy for the logical simulator to accurately verify connections between terminals of an analog macro and terminals of a logic circuit. This is because the logical simulator handles, as a signal whose logic is indefinite, an analog signal whose potential level is in a state other than the H or L state.

Here, to accurately verify connections between circuit terminals, it is possible to use an analog simulator capable of handling both a logical signal and an analog signal. However, it takes a long time to perform verification of connections between circuit terminals by using the analog simulator, and the verification is expensive.

In addition, to reduce the verification time and cost, it is possible that the connections between the circuit terminals be verified by visual inspection of a designer. However, in the verification by the visual inspection of the designer, there is a possibility that human error may occur.

Accordingly, to reduce the verification time and cost, a method that uses a logical simulator to verify connections between terminals of an analog macro and terminals of a logic circuit has been proposed. By way of example, the following method (see, for example, Japanese Unexamined Patent Application Publication No. 2004-273476) has been proposed.

At first, a semiconductor integrated circuit is assumed in which a digital circuit block, a bias circuit that outputs bias signals in response to a signal from the digital circuit block, and analog circuit blocks that operate in response to the bias signals are connected to one another. In this case, since the bias signals are analog signals, the logical simulator handles the bias signals as signals whose states are indefinite. Thus, the logical simulator cannot verify connections of wires that transmit the bias signals between the digital circuit block and the analog circuit block. Accordingly, in the bias circuit, a first pseudo pulse generating circuit is provided. The first pseudo pulse generating circuit generates a first pseudo pulse signal in the "H" or "L" state which has a different pulse width. In addition, in each analog circuit block, a second pseudo pulse generating circuit is provided. In response to the first pseudo pulse signal, the second pseudo pulse generating circuit generates a second pseudo pulse signal in the "H" or "L" state. When the pulse width of the first pseudo pulse signal and the pulse width of the second pseudo pulse signal are equal to each other, it is determined that connection is established between a predetermined terminal of the analog circuit block and a predetermined terminal of the digital circuit block.

The verifying method, disclosed in Japanese Unexamined Patent Application Publication No. 2004-273476, for verifying the connections between the terminals of the analog macro and the terminals of the logic circuit, has a problem in that, to verify the connections, an additional number of clocks for the longest pseudo pulse width is required. The word "longest" is used because, when analog signals exist in a circuit to be verified, to differentiate the analog signals, pseudo pulses having different lengths are assigned to the analog signals.

The verifying method also has a problem in that, since a pseudo circuit whose operation differs from the actual circuit operation is needed, in addition to verification of the actual circuit operation, a period in which the pseudo circuit operates is additionally needed.

In addition, the verifying method, disclosed in Japanese Unexamined Patent Application Publication No. 2004-273476, for verifying the connections between the circuits, is effective in verifying connections between the logic circuit and the bias circuit and in verifying connections between the bias circuit and the analog circuits. However, the verifying method has a problem in that it is not effective in verifying connections between a logic circuit and an analog circuit such as an analog-to-digital conversion circuit or a digital-to-analog conversion circuit.

This is based on the following reason. Each bias signal can be replaced by a logical signal having a fixed pulse width since the bias signal has a substantially fixed potential. However, a logical signal input from the digital circuit, or a logical signal output to the digital circuit changes the potential of an analog signal handled by the analog-to-digital conversion circuit or the digital-to-analog conversion circuit. Thus, in each pseudo pulse generating circuit, disclosed in Japanese Unexamined Patent Application Publication No. 2004-273476, for generating a single pulse, the change in potential cannot be represented.

SUMMARY OF THE INVENTION

It is an object of the present invention to provide a terminal connection verifying method for a semiconductor circuit device that is effective in verifying connections between a logic circuit and an analog circuit such as an analog-to-digital conversion circuit or a digital-to-analog conversion circuit, and a CAD (computer-aided design) apparatus for implementing the terminal connection verifying method.

A semiconductor-circuit-device verifying method of the present invention for solving the above problems relates to a verifying method in which the operation of a semiconductor circuit device is verified by inputting, to a logical simulator, a logical model representing a logic circuit and a logical model representing an analog circuit. The semiconductor-circuit-device verifying method includes adding, to the logical model representing the analog circuit, a function that generates a function value in accordance with the state of connection between terminals of the analog circuit and terminals of the logic circuit, performing logical simulation to output the result of comparing the function value generated by the function and an expected value, and, based on the result of the comparison, determining whether or not there is a connection error between an input terminal or output terminal of the analog circuit and a terminal of the logic circuit.

In addition, a CAD apparatus for solving the above problems and implementing the semiconductor-circuit-device verifying method of the present invention relates to a CAD apparatus in which the operation of a semiconductor circuit device is verified by using a logical model representing a logic circuit and a logical model representing an analog circuit. The CAD apparatus includes means that adds, to the logical model representing the analog circuit, a function which generates a function value in accordance with the state of connection between terminals of the analog circuit and terminals of the logic circuit, and in which an integer is used as an argument value or the function value, means which performs logical simulation to output the result of comparing the function value generated by the function and an expected value, and means that, based on the result of the comparison, determines whether or not there is a connection error between an input terminal or output terminal of the analog circuit and a terminal of the logic circuit.

DESCRIPTION OF THE PREFERRED EMBODIMENTS

First and second embodiments of the present invention are described below.

First Embodiment

The first embodiment relates to an LSI (large scale integrated circuit) verifying method that determines whether there is a connection error between terminals of a logic circuit and terminals of a digital-to-analog-conversion-circuit macro, and a CAD apparatus for realizing the verifying method. The LSI verifying method according to the first embodiment and CAD apparatus for realizing the verifying method are described below with reference to FIGS. 1, 2A to 2C, 3, A, 4B, and 5.

Figure 1:
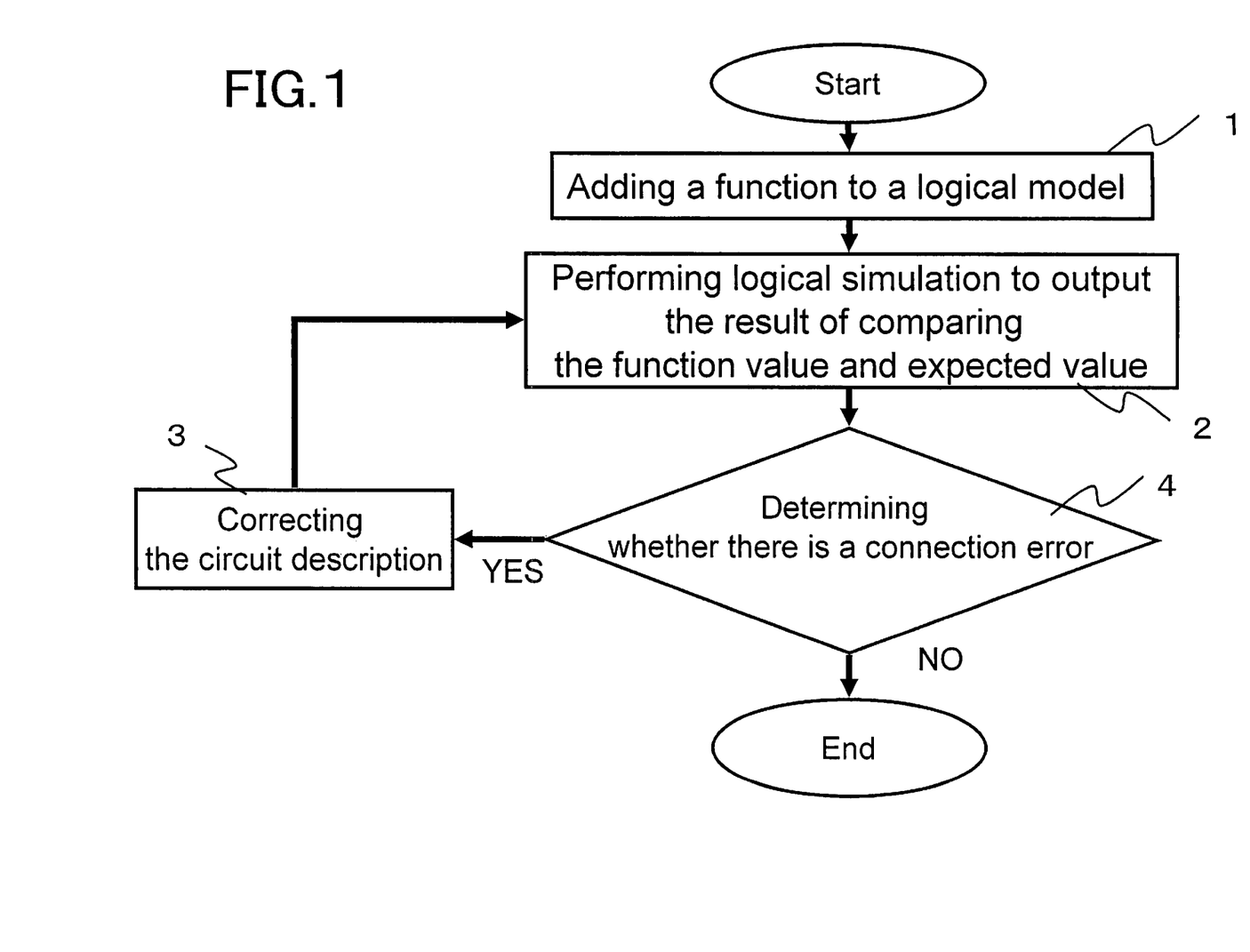
FIG. 1 is a flowchart showing an LSI verifying method.

FIG. 1 is a flowchart showing the LSI verifying method. The flowchart in FIG. 1 shows that the LSI verifying method includes step 1 of adding a function to a logical model, step 2 of performing logical simulation, step 3 of correcting a circuit description, and step 4 of, by comparing a function value and an expected value, determining whether there is a connection error.

In step 1 of adding the function to the logical model, a predetermined function is added to a logical model for use in logical simulation. Step 1 is described later with reference to FIGS. 2A to 2C.

In step 2 of performing logical simulation to output the result of comparing the function value and the expected value, logical simulation concerning the LSI is performed by using a circuit description, a logical model, etc., and the result of comparing a function value from the function added to the logical model and a predetermined expected value is output. Step 2 is described later with reference to FIG. 3.

In step 3 of correcting the circuit description, a circuit description representing the LSI is corrected. Step 3 is described later with reference to FIGS. 4A and 4B.

In step 4 of determining whether there is a connection error, based on the result of comparing the function value and the expected value, if both values are equal to each other, it is determined that there is no connection error between the logic circuit and the digital-to-analog circuit macro, and, if both values differ, it is determined that there is a connection error. If it is determined that there is no connection error, verification of the LSI is finished. If there is a connection error, the method proceeds to step 3 of correcting the circuit description representing the LSI.

Figure 2A:
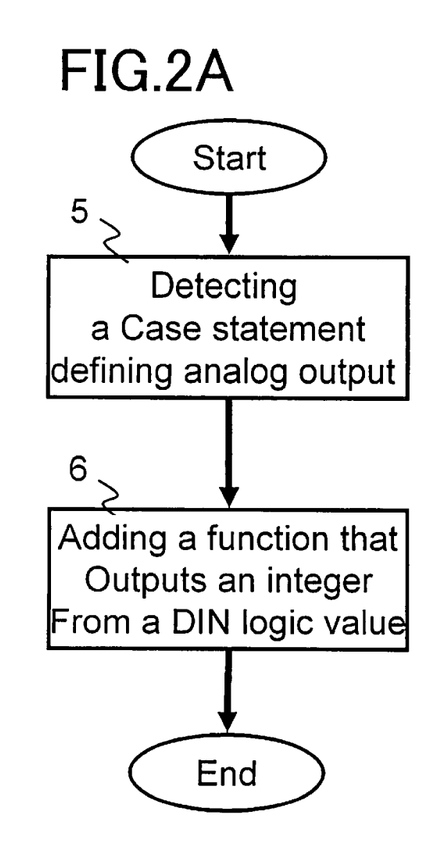
FIGS. 2A, 2B, and 2C are a flowchart and block diagrams of a step of adding a function to a logical model.
Figure 2B:
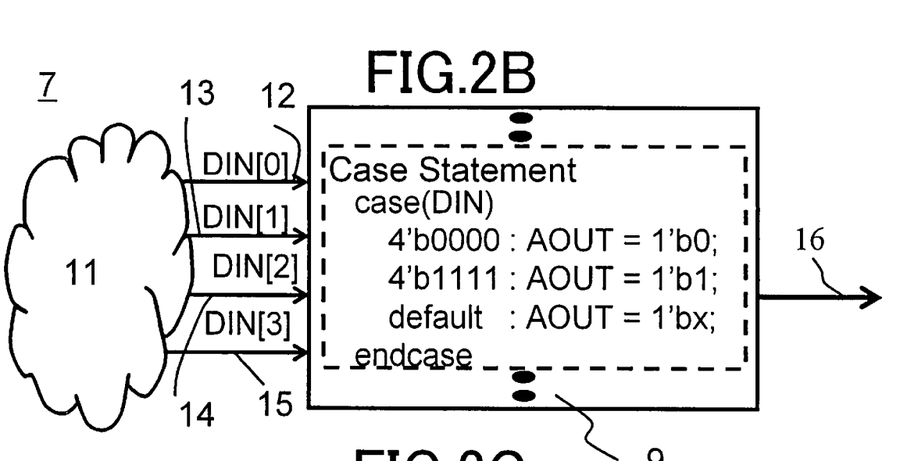
Figure 2C:
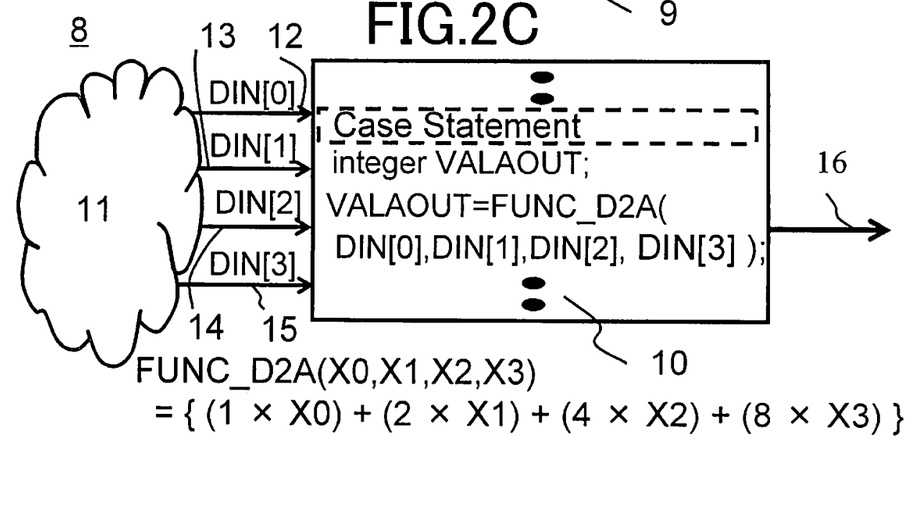

FIGS. 2A to 2C illustrate a step of adding a function to a logical model. FIG. 2A illustrates step 5 of detecting a Case statement defining analog output and step 6 of adding a function that outputs an integer from a DIN logic value. FIG. 2B illustrates a circuit description 7 before the function is added, a circuit description 8 after the function is added, a logical model 9 of the digital-to-analog conversion circuit macro before the function is added, a logical model 10 of the digital-to-analog conversion circuit macro after the function is added, a description 11 representing a logic circuit, connections 12, 13, 14, and 15 between logic circuit terminals and terminals of the digital-to-analog-conversion-circuit macro, and terminal AOUT 16 of the digital-to-analog-conversion-circuit macro.

FIG. 2A shows that the step of adding the function to the logical model includes step 5 of detecting a Case statement defining analog output, and step 6 of adding the function that outputs an integer from a DIN logical value.

FIG. 2B shows that the circuit description 7 before the function is added includes the logic circuit description 11, the logical model 9 including terminal AOUT 16, and the connections 12, 13, 14, and 15 between the logical circuit terminals and the terminals of the digital-to-analog-conversion-circuit macro. According to the circuit description 7 before the function is added, as shown in the Case statement of the logical model 9, it is described that, when the digital-to-analog-conversion-circuit macro receives logical signals DIN[0], DIN[1], DIN[2], and DIN[3]) through the connections 12, 13, 14, and 15, the digital-to-analog-conversion-circuit macro outputs the following output signal from terminal AOUT 16.

In other words, according to the Case statement of the logical model 9, when the logical signals DIN[0], DIN[1], DIN[2], and DIN[3] are all "0's", the digital-to-analog-conversion-circuit macro outputs, from the terminal AOUT 16, a logical signal having logic "0". When the logical signals DIN[0], DIN[1], DIN[2], and DIN[3] are all "1's", the digital-to-analog-conversion-circuit macro outputs, from the terminal AOUT 16, a logical signal having logic "1". In addition, when the logical signals DIN[0], DIN[1], DIN[2], and DIN

[3] are all "1's" or "0's", the digital-to-analog-conversion-circuit macro outputs, from the terminal AOUT 16, a logical signal having indefinite state "X".

Although, in the Case statement of the logical model 9, the signal output from the terminal AOUT 16 is handled as a logical signal, it is obvious that, in the actual operation of the digital-to-analog conversion circuit, an analog signal is output.

Therefore, in a description that connects the logic circuit terminals and the terminals of the digital-to-analog-conversion-circuit macro, even if the connections 12, 13, 14, and 15 are switched, the logical model 9 identically operates.

FIG. 2C shows that the circuit description 8 after the function is added includes the logic circuit description 11, the logical model 10 including terminal AOUT16, and a description of the existence of the connections 12, 13, 14, and 15 between the logic circuit terminals and the terminals of the digital-to-analog-conversion-circuit macro. According to the circuit description 8 after the function is added, as shown in the Case statement of the logical model 10, when the digital-to-analog-conversion-circuit macro receives logical signals DIN[0], DIN[1], DIN[2], and DIN[3], the digital-to-analog-conversion-circuit macro outputs, from terminal AOUT16, an output signal similar to that of the logical model 9. However, according to the circuit description 8 after the function is added, since the logical model 10 has the following description added thereto, the logical model 10 outputs an integer function value in accordance with the logic of logical signals DIN[0], DIN[1], DIN[2], and DIN[3]. The description added to the logical model 10 is the following function description:

```
integer VALOUT;
VALOUT=FUNC_D2A(DIN[0], DIN[1], DIN[2], DIN[3]);
FUNC_D2A(X0, X1, X2, X3)
  ={(1×X0) + (2×X1) + (4×X2) + (8×X3)}
```

When, in the function FUNC_D2A(X0, X1, X2, X3), X0 to X3 are 1's or 0's, the function FUNC_D2A(X0, X1, X2, X3) generates an integer function value. The mathematical expression that represents the function FUNC_D2A(X0, X1, X2, X3) is an example in which, when X0 to X3 are 1's or 0's, an integer function value is generated. The mathematical expression may have any form if, when a change occurs in correspondences between X0 to X3, and DIN[0], DIN[1], DIN[2 ], and DIN[3], the change can be detected based on a function value generated by the expression in the form. In other words, the function FUNC_D2A(X0, X1, X2, X3) may be a function that generates a function value in accordance with a connecting state between the terminals of a digital-to-analog-conversion-circuit macro and the terminals of a logical circuit.

Therefore, in the description that connects the terminals of the logical circuit and the terminals of the digital-to-analog-conversion-circuit macro, when the connections 12, 13, 14, and 15 are switched, the function value of the function FUNC_D2A(X0, X1, X2, X3), in which the logical values of the DIN[0], DIN[1], DIN[2], and DIN[3] are used as arguments, differs from an expected value.

Accordingly, in "step 5 of detecting a Case statement defining analog output" included in the step of adding the function to the logical model, in a logical model (e.g., the logical model 9) that represents the digital-to-analog-conversion-circuit macro, a Case statement describing the logic of an output signal to be output to an output terminal (e.g., AOUT16) of the digital-to-analog-conversion-circuit macro is detected in accordance with logic at the input terminals of the digital-to-analog-conversion-circuit macro.

Next, in "step 6 of adding the function of outputting the integer from the logical value of DIN" included in the step of adding the function to the logical model, by adding the function description (described with reference to FIGS. 2B and 2C) to a logical model (e.g., the logical model 9) representing a digital-to-analog-conversion-circuit macro, a new logical model (e.g., the logical model 10) is created.

Figure 3:
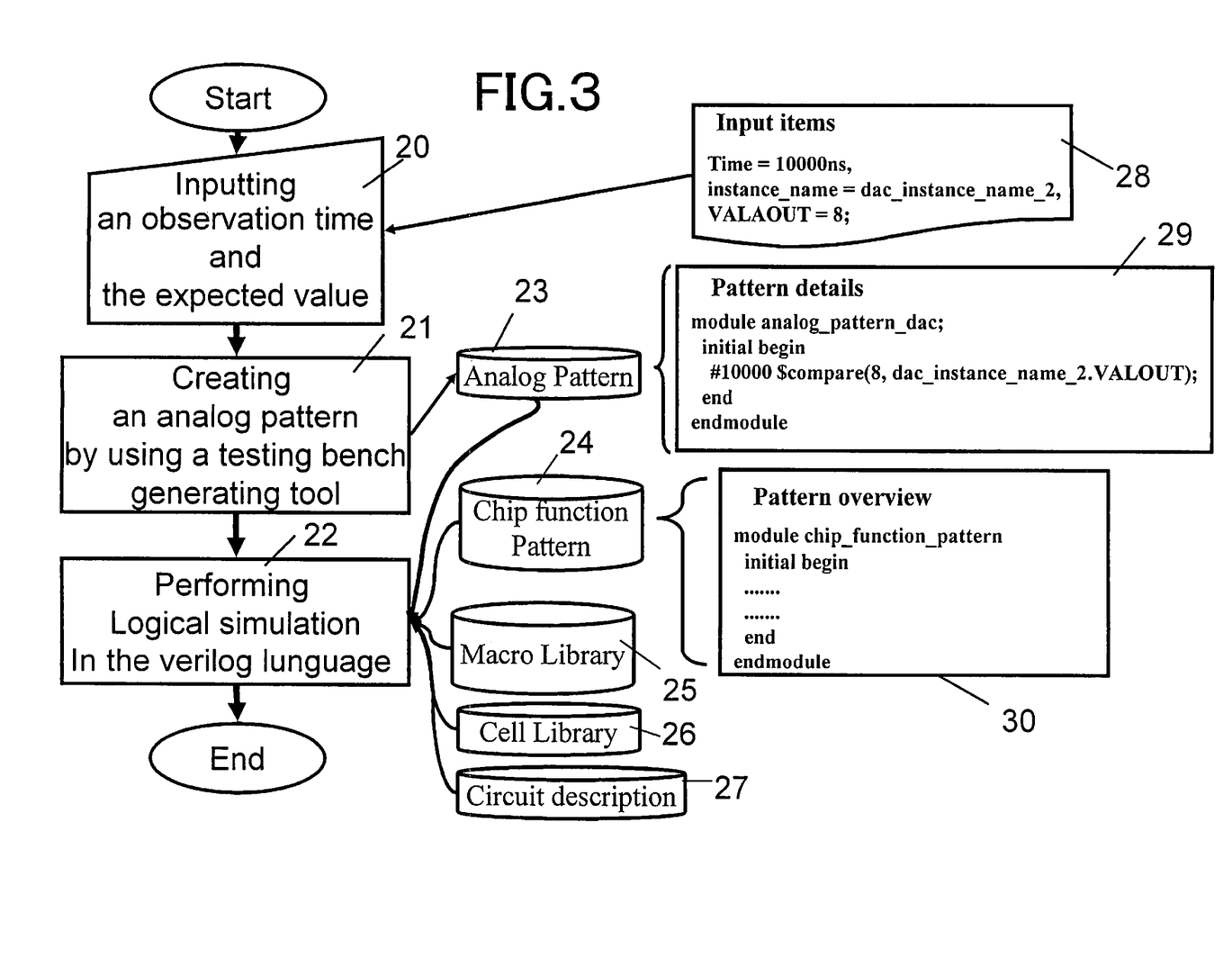
FIG. 3 is a flowchart showing details of a step of performing logical simulation to output the result of comparing a function value generated by a function and an expected value.

FIG. 3 shows details of the step of performing logical simulation to output the result of comparing the function value generated from the function and the expected value. FIG. 3 shows that the step shown in FIG. 3 includes step 20 of inputting an observation time and an expected value, step 21 of creating an analog pattern by using a testing bench generating tool, and step 22 of performing logical simulation in the Verilog language. FIG. 3 also shows input items 28 that are input in step 20 of inputting the observation time and the expected value. The input items 28 include a comparing period in which the function value and the expected value are compared with each other, a variable concerning the function value, and an expected value. The input items 28 include, for example, "Time=10000 nsec", "instance_name=dac_nstance_name_2", "VALAOUT=8". The logical value of DIN is determined in the "comparing period". FIG. 3 also shows the analog pattern 23 created in the analog pattern creating step 21 using the testing bench generating tool in response to the input items 28, and pattern details 29 of the analog pattern 23. The pattern details 29 include a module name, a statement defining an operation start, a comparison statement, a statement defining the end of the operation, a statement defining the end of the pattern, and a module end. The pattern details 29 include, for example, "module analog_pattern_dac", "initial begin", "#10000 $compare (8, dac_instance_name_2. VALOUT); end", and "endmodule". FIG. 3 also shows a chip function pattern 24, a macro library 25, a cell library 26, and a circuit description 27 which are used in step 22 of performing logical simulation in the Verilog language. In addition, a pattern overview 30 of the chip function pattern 24 includes a module name, an operation start, a pattern, an operation end, and a module end. The pattern overview 30 includes, for example, "module chip_function_pattern", "initial begin", "pattern", "end", and "endmodule".

Accordingly, as the result of performing the step of outputting the result of comparing-the function value generated from the function and the expected value, equality and inequality between the function value and the expected value are indicated. Although, in the foregoing, the logical simulation in the Verilog language is performed, in which an integer other than zero or one is used as the function value, it is obvious that any language may be used for the logical simulation if an integer other than zero or one is used as the function value in the language. The language may be the Verilog-VHDL language or the like.

Next, the step of determining the occurrence of a connection error on the basis of the result of the comparison is performed. If, as the result of performing the step of determining the occurrence of the connection error, it is indicated that the expected value and the function value are equal to each other, it is determined that there is no connection error. After that, the verifying step finishes. Alternatively, if the expected value and the function value are not equal to each other, it is determined that there is a connection error, and the method proceeds to the step of correcting the circuit description.

Figure 4A:
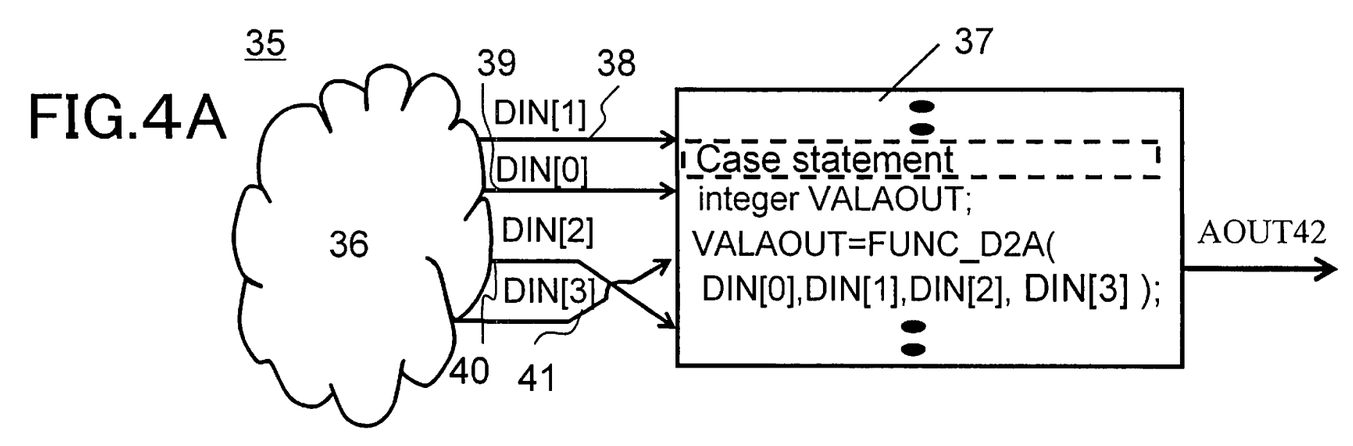
FIGS. 4A and 4B are block diagrams showing a step of correcting a circuit description.
Figure 4B:
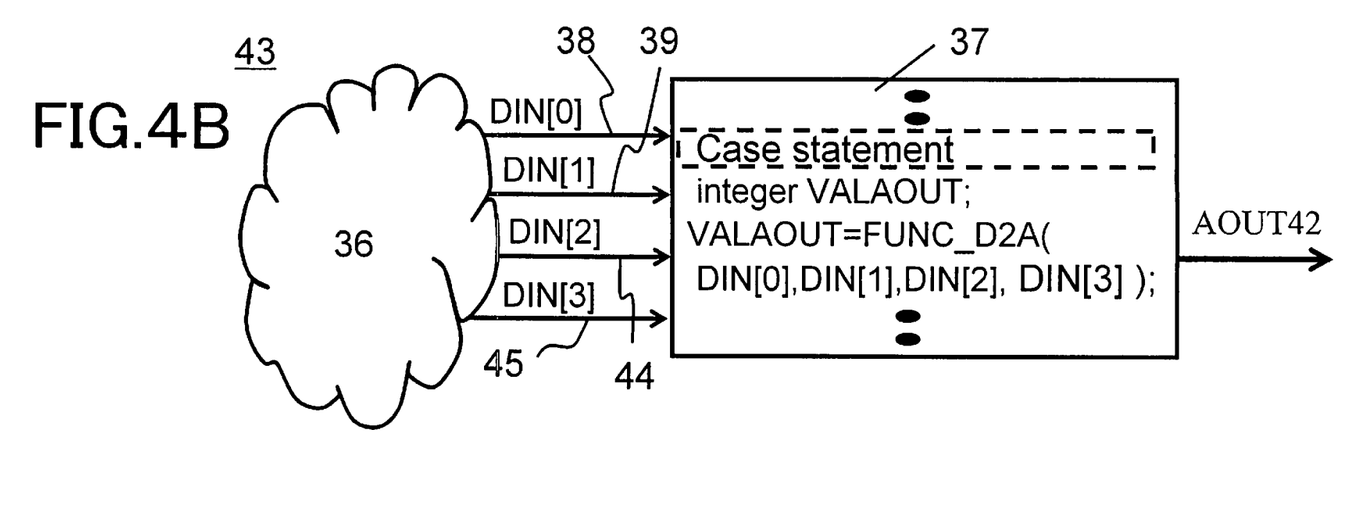

FIGS. 4A and 4B are block diagrams of the step of correcting a circuit description. FIGS. 4A and 4B also show a circuit description 35 in which a connection error exists, and a circuit description 43 with a connection error corrected. The circuit description 35 includes a logic circuit description 36, a logical model 37 of a digital-to-analog-conversion-circuit macro including output terminal AOUT42, and descriptions of connections 38, 39, 40, and 41 which transmit logical signals DIN[0], DIN[1], DIN[2], and DIN[3] and which connect terminals of the logic circuit and terminals of the digital-to-analog conversion circuit. The circuit description 43 is similar to the circuit description 35. However, the connections 38, 39, 40, and 41 which transmit logical signals DIN[0], DIN[1], DIN[2], and DIN[3] and which connect terminals of the logic circuit and terminals of the digital-to-analog conversion circuit macro differ from those in the circuit description 35. Specifically, in the circuit description 35, the connections 40 and 41 are connected to the digital-to-analog conversion circuit, with them switched. In the circuit description 43, the connections 44 and 45 corresponding to the connections 40 and 41 are connected to the digital-to-analog conversion circuit, with the switched connections corrected.

In this case, by performing logical simulation using the circuit description 35, when DIN[0], DIN[1], DIN[2], and DIN[3] have logical values "0", "0", "0", and "1", respectively, the function value shown in FIG. 4B is 4. This is because the connections 40 and 41 concerning DIN[2] and DIN[3] are switched. Therefore, the expected value is 8, thus determining that a connection error exists.

Accordingly, in the step of correcting the circuit description, the circuit description is corrected so that the function value is equal to the expected value. The step of correcting the circuit description is, for example, a step in which, by using the connections 44 and 45 to correct the circuit description 35, the circuit description 43 is obtained.

Figure 5:
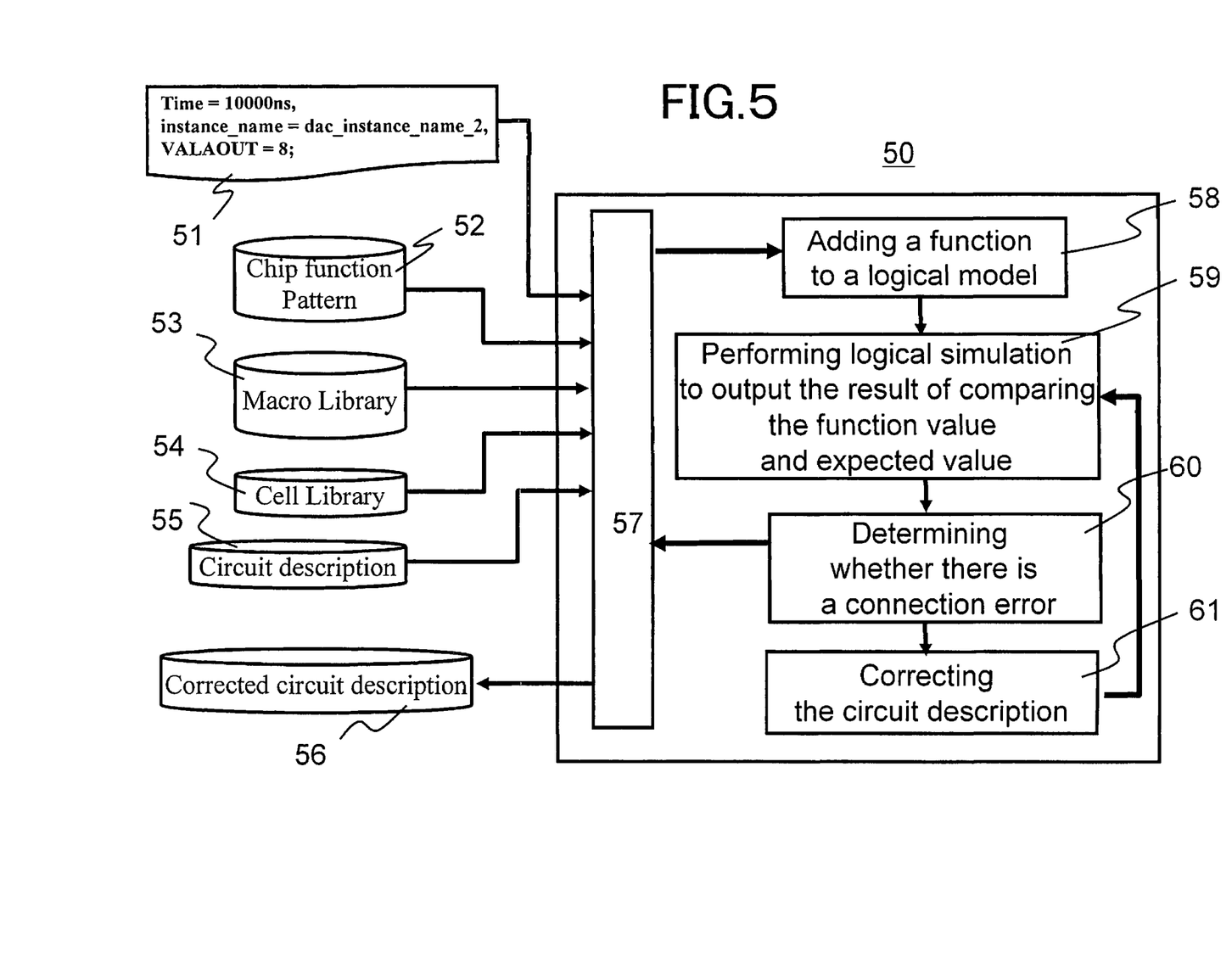
FIG. 5 is a block diagram showing a CAD apparatus for realizing a semiconductor-circuit-device verifying method according to a first embodiment of the present invention.

FIG. 5 is a block diagram showing a CAD apparatus 50 for realizing the semiconductor-circuit-device verifying method according to the first embodiment. In addition to the CAD apparatus 50, FIG. 5 shows an input document 51, a chip function pattern 52, a macro library 53, a cell library 54, a circuit description 55, and a corrected circuit description 56. The CAD apparatus 50 includes an input/output means 57, means 58 that adds a function to a logical model, means 59 which performs logical simulation to output the result of comparing a function value and an expected value, means 60 which, based on the result of the comparison, determines whether there is a connection error, and a circuit-description correcting means 61. The input/output means 57 receives the chip function pattern 52, the macro library 53, the cell library 54, and the circuit description 55, and outputs the corrected circuit description 56. The means 58 performs an operation similar to that in the step, described with reference to FIGS. 2A to 2C, of adding the function to the logical model. The means 59 that performs logical simulation to output the result of comparing the function value and the expected value performs an operation which is similar to that described with reference to FIG. 3. The means 60 which, based on the result of the comparison, determines whether there is a connection error performs an operation which is similar to that in the step of determining, based on the result of the comparison in FIG. 1, whether there is a connection error. The circuit-description correcting means 61 performs an operation which is similar to that in the step, described with reference to FIGS. 4A and 4B, of correcting the circuit description. The input document 51 has content similar to the input items 28 shown in FIG. 3. The chip function pattern 52, the macro library 53, and the cell library 54 are similar to the chip function pattern, macro library, and cell library shown in FIG. 3, respectively. Therefore, according to the CAD apparatus 50 in FIG. 5, the semiconductor-circuit-device verifying method according to the first embodiment can be realized.

The semiconductor-circuit-device verifying method according to the first embodiment is a verifying method in which the operation of a semiconductor circuit device including a logic circuit and an analog circuit is verified by inputting, to a logical simulator, a logical model representing the logic circuit and a logical model representing an analog circuit, and which includes the steps of adding, to the logical model representing the analog circuit, a function that generates an integer value in response to an input signal received from the logic circuit through an input terminal, performing logical simulation to output the result of comparing the integer value output from the function and an expected value, and, based on the result of the comparison, determining whether or not there is a connection error between an input terminal or output terminal of the analog circuit and a terminal of the logic circuit. Therefore, according to the semiconductor-circuit-device verifying method according to the first embodiment, an advantage is obtained in that a connection error between a logic circuit and an analog circuit can be detected by performing logical simulation without performing analog simulation. In addition, an advantage is obtained in that, since logical simulation is used to detect a connection error, the need to generate pseudo pulses is eliminated, so that an additional number of clocks is not needed.

Furthermore, the semiconductor-circuit-device verifying method according to the first embodiment includes the step of correcting a circuit description. Thus, according to the semiconductor-circuit-device verifying method according to the first embodiment, when there is a connection error between a logic circuit and an analog circuit, by correcting a circuit description, a circuit description having no connection error can be obtained.

The semiconductor-circuit-device verifying method according to the first embodiment has a feature in that, particularly as an analog circuit, a digital-to-analog-conversion-circuit macro is handled.

In addition, the CAD apparatus for realizing the semiconductor-circuit-device verifying method according to the first embodiment is a CAD apparatus in which the operation of a semiconductor circuit device including a logic circuit and an analog circuit is verified by using a logical model representing the logic circuit and a logical model representing the analog circuit, and which includes means that adds, to the logical model representing the analog circuit, a function that generates an integer value in response to an input signal received from the logic circuit through an input terminal or an output signal output to the logic circuit through an output terminal, means which performs logical simulation to output the result of comparing the integer value output from the function and an expected value, and means which, based on the result of the comparison, determines whether or not there is a connection error between the input terminal or output terminal of the analog circuit and a terminal of the logic circuit. Therefore, according to the CAD apparatus for realizing the semiconductor-circuit-device verifying method according to the first embodiment, an advantage is obtained in that, by performing logical simulation for a semiconductor circuit device, a connection error between a logic circuit and an analog circuit can be detected.

In addition, the CAD apparatus for realizing the semiconductor-circuit-device verifying method according to the first embodiment further includes means that corrects a circuit description. Therefore, according to the CAD apparatus for realizing the semiconductor-circuit-device verifying method according to the first embodiment, when a connection error occurs between a logic circuit and an analog circuit, by correcting a circuit description, a circuit description having no connection error can be obtained.

Second Embodiment

A second embodiment of the present invention relates to an LSI verifying method for determining whether there is a connection error between terminals of a logic circuit and terminals of an analog-to-digital-conversion-circuit macro, and to a CAD apparatus for realizing the LSI verifying method. The LSI verifying method according to the second embodiment and a CAD apparatus therefor are described with reference to FIGS. 6A to 6C, 7, and 8.

At first, a flowchart showing the LSI verifying method according to the second embodiment is similar to that shown in FIG. 1. In addition, in the LSI verifying method according to the second embodiment, a step of correcting a circuit description is similar to that in the LSI verifying method (shown in FIGS. 4A and 4B) according to the first embodiment.

Figure 6A:
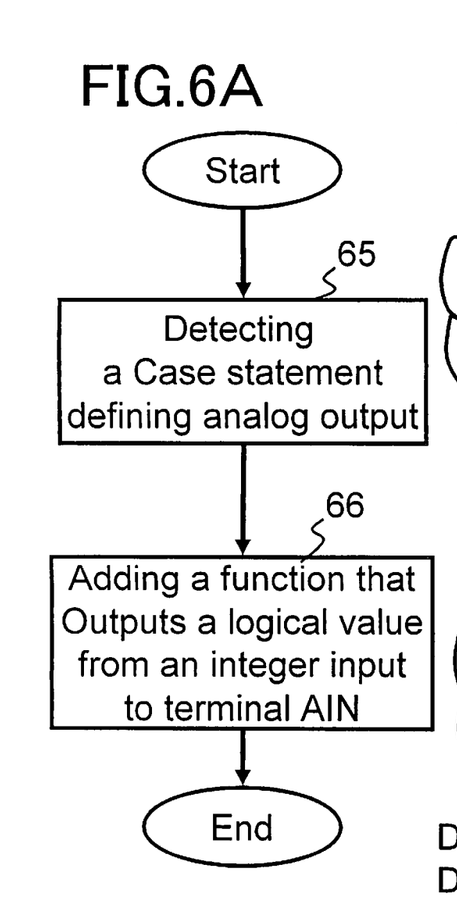
FIGS. 6A, 6B, and 6C are a flowchart and block diagrams of, in a verifying method according to a second embodiment of the present invention, adding a function to a logical model.
Figure 6B:
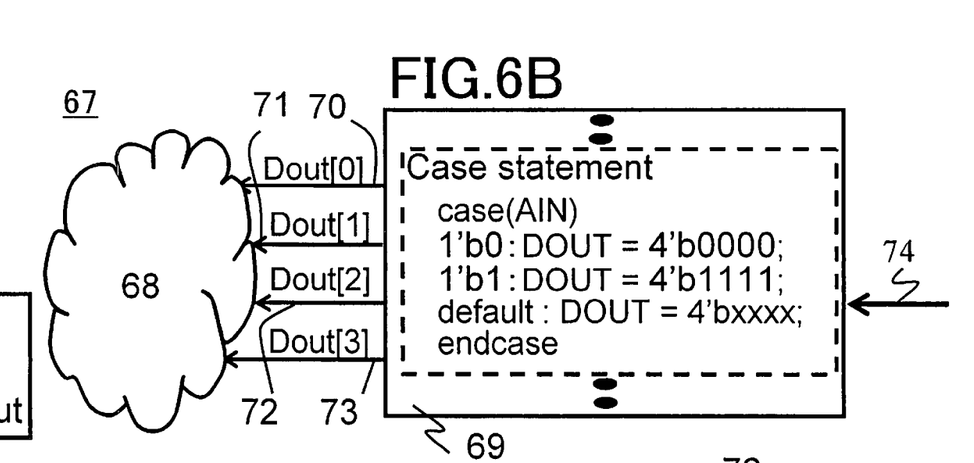
Figure 6C:
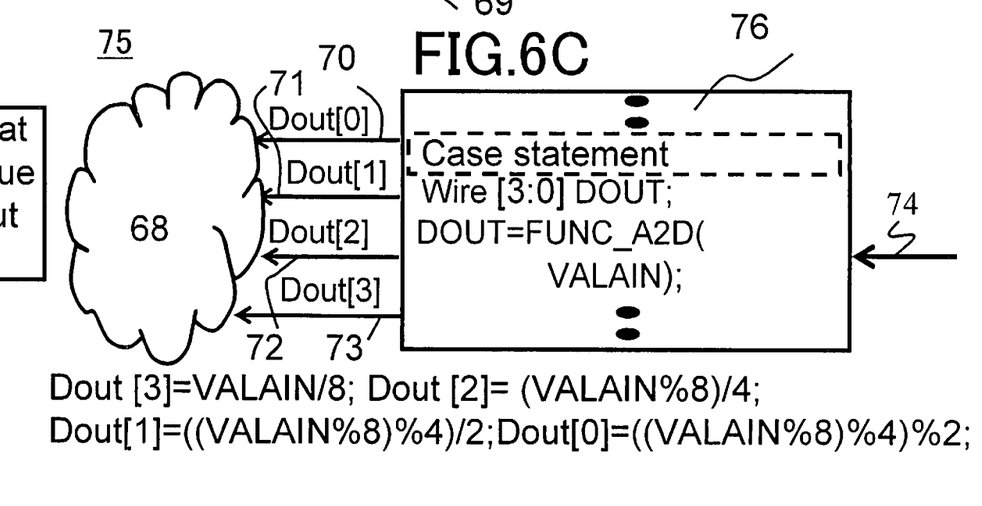

FIGS. 6A, 6B, and 6C are a flowchart and block diagrams showing a step of adding a function to a logical model. FIG. 6A shows step 65 of detecting a Case statement defining an analog input and step 66 of adding a function that outputs a logical value from an integer input to terminal AIN (FIGS. 6B and 6C). FIG. 6B shows a circuit description 67 before a function is added, and FIG. 6C shows a circuit description 75 after the function is added. FIG. 6B shows a logical model 69 of an analog-to-digital-conversion-circuit macro before the function is added, and FIG. 6C shows a logical model 76 of digital-to-analog-conversion-circuit macro after the function is added. FIG. 6B shows a logic circuit description 68, connections 70, 71, 72, and 73 between terminals of the logic circuit and terminals of the digital-to-analog-conversion-circuit macro, and terminal AIN74 of the analog-to-digital-conversion-circuit macro.

FIG. 6A shows that the step of adding the function to the logical model in the second embodiment includes step 65 of detecting a Case statement defining an analog input and step 66 of adding a function that outputs an integer from a logical value at Dout.

FIG. 6B shows that the circuit description 67 before the function is added includes the logic circuit description 68, and descriptions of the logical model 69 including terminal AIN74 and the existence of the connections 70, 71, 72, and 73 between the terminals of the logical model and terminals of the analog-to-digital-conversion-circuit macro. The circuit description 67 before the function is added indicates that, as shown in the Case statement of the logical model 69, when the analog-to-digital-conversion-circuit macro receives a signal from terminal AIN74, the analog-to-digital-conversion-circuit macro outputs logical signals Dout[0], Dout[1], Dout[2], and Dout[3] from the terminal of the logic circuit through the connections 70, 71, 72, and 73.

In other words, according to the Case statement of the logical model 69, when a logical signal having logic "0" is input to terminal AIN74, the analog-to-digital-conversion-circuit macro outputs logical signals Dout[0], Dout[1], Dout [2], and Dout[3], which all have logic "0's". When a logical signal having logic "1" is input from terminal AIN74, the analog-to-digital-conversion-circuit macro outputs logical signals Dout[0], Dout[1], Dout[2], and Dout[3], which all have logic "1's". In addition, when a logical signal having indefinite state "X" is input from terminal AIN74, the analog-to-digital-conversion-circuit macro outputs logical signals Dout[0], Dout[1], Dout[2], and Dout[3], which all have indefinite states in logic.

In the Case statement of the logical model 69, the signal input from terminal AIN74 is handled as a logical signal, it is obvious that, in the actual operation of the analog-to-digital-conversion-circuit macro, an analog signal is input.

Therefore, in the description of connecting the terminals of the logic circuit and the terminals of the analog-to-digital-conversion-circuit macro, the logical model 69 identically operates, even if the connections 70, 71, 72, and 73 are switched.

FIG. 6C shows that the circuit description 75 that adds the function includes the logic circuit description 68, and descriptions of the logical model 76 including terminal AIN74 and the existence of the connections 70, 71, 72, and 73 between the terminals of the logic circuit and the terminals of the analog-to-digital-conversion-circuit macro. According to the circuit description 75 after the function is added, as shown in the Case statement of the logical model 76, when an input signal that is similar to that in the logical model 76 is input from terminal AIN74, the analog-to-digital-conversion-circuit macro outputs logical signals Dout[0], Dout[1], Dout[2], and Dout[3] identically to the case of the logical model 76. However, according to the circuit description 75 after the function is added, since the following description is added, the logical model 76 outputs logical signals Dout[0], Dout[1], Dout[2], and Dout[3], which have logical values derived from the mathematical expression of the function on the basis of integer values input to the function. The description added to the logical model 76 is the following function description:

```
wire[3;0] DOUT;
DOUT=FUNC_A2D(VALAIN);
DOUT[3] = VALAIN/8;DOUT[2] = (VALAIN%8)/4;
DOUT[1] = ((VALAIN%8)%4)/2;
DOUT[0] = ((VALAIN%8)%4)%2;
``` where the above JALAIN is an integer of 0 to 15. The symbol "/" means performing division and means that, when a value is indivisible, only a quotient is extracted. The symbol "%" means that, after division is performed, a remainder is extracted.

The above mathematical expression DOUT=FUNC_A2D (VALAIN) is an example of a function in which, when an integer from 0 to 15 is input to VALAIN, the function gives a logical value of "0" or "1". The function may be represented by any mathematical expression if, when a change occurs in logical signals Dout[0], Dout[1], Dout[2], and Dout[3], the change can be detected by the mathematical expression. In other words, the function FUNC_A2D(VALAIN) may be a function that generates a function value in accordance with a connecting state between the terminals of the analog-to-digital-conversion-circuit macro and the terminals of the logic circuit.

Therefore, in the description of connecting the terminals of the logic circuit and the terminals of the analog-to-digital-conversion-circuit macro, when the connections 70, 71, 72, and 73 are switched, the logical values of logical signals Dout[0], Dout[1], Dout[2], and Dout[3] differ from expected values.

Accordingly, in "step 65 of detecting the Case statement defining the analog input" which is included in the step of adding the function to the logical model, in a logical model (e.g., the logical model 69) representing an analog-to-digitalconversion-circuit macro, in accordance with an integer value input to an input terminal (e.g., AIN74) of the analog-to-digital-conversion-circuit macro, a Case statement is detected which defines the logic of an output signal to be output to an output terminal of the analog-to-digital-conversion-circuit macro.

Next, in "step 66 of adding the function that outputs the logical value from the integer input to terminal AIN" which is included in the step of adding the function to the logical model, the function description described with reference to FIG. 6B is added to a logical model (e.g., the logical model 69) representing the analog-to-digital-conversion-circuit macro, whereby a new logical model (e.g., the logical model 76) is created.

Figure 7:
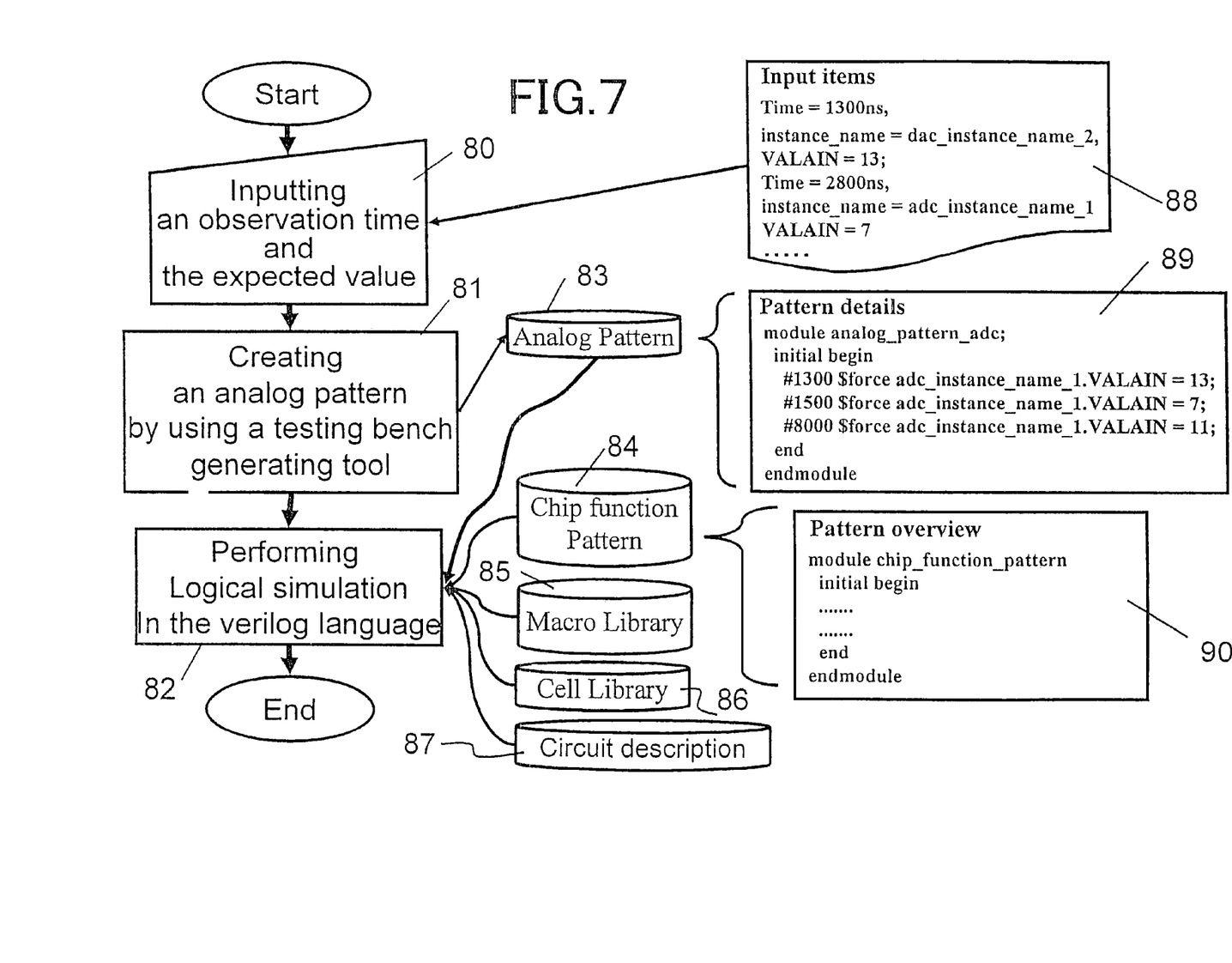
FIG. 7 is a flowchart showing a step, in the verifying method according to the second embodiment, of performing logical simulation to output the result of comparing a function value generated by the function and an expected-value.

FIG. 7 is an illustration of, in the verifying method according to the second embodiment, a step of performing logical simulation to output the result of comparing the function value generated from the function and the expected value. FIG. 7 shows that the shown step includes step 80 of inputting an observation time and an expected value, step 81 of creating an analog pattern by using a testing bench generating tool, and step 82 of performing logical simulation in the Verilog language. FIG. 7 also shows input items 88 input in step 80 of inputting the observation time and the expected value. The input items 88 include a comparing period in which the function value and the expected value are compared with each other, a variable concerning an input value which is input to the function, and the input value. The input items 88 include, for example, "Time=1300 nsec", "instance name=dac_instance_name_2", VALAIN=13, "Time=2800 nsec", "instance_name=dac_instance_1", and "VALAIN=7". The expected value is set in the "comparing period" by the logic circuit. FIG. 7 also shows the analog pattern 83 created in the analog pattern creating step 81 using the testing bench generating tool in response to the input items 88, and pattern details 89 of the pattern. The pattern details 89 include a module name, a statement defining an operation start, a comparison statement, a statement defining an operation end, a statement defining a pattern end, and a module end. The pattern details 89 include, for example, "module analog_pattern_adc", "initial begin", "#1300 $force adc_instance_name_1. VALAIN=13;", "#2800$ force_adc_instance_name_2. VALAIN=7;", "#8000 $force adc_instance_name_3. VALAIN=11; end", and "endmodule". FIG. 7 further shows a chip function pattern 84, a macro library 85, a cell library 86, and a circuit description 87 which are used in step 82 of performing logical simulation in the Verilog language. In addition, a pattern overview 90 of the chip function pattern 84 includes a module name, an operation start, a pattern, an operation end, and a module end. The pattern overview 90 includes, for example, "module chip_function=pattern", "initial begin", "pattern", "end", and "endmodule".

Accordingly, as the result of performing the step of outputting the result of comparing the function value generated from the function and the expected value, LSI logical simulation is performed, whereby equality and inequality between the expected value and the function value can be found. Although, in the foregoing, the logical simulation in the Verilog language is performed, in which each of integers other than zero or one is used as the function value, it is obvious that any language may be used or the logical simulation if each of integers other than zero or one is used as the function value in the language. The language may be the Verilog-VHDL language or the like.

Next, the step of determining the occurrence of a connection error on the basis of the result of the comparison is performed. If, as the result of performing the step of determining the occurrence of the connection error, it is indicated that the expected value and the function value equal to each other, it is determined that there is no connection error. After that, the verifying step finishes. Alternatively, if the expected value and the function value are not equal, it is determined that there is a connection error, and the method proceeds to the step of correcting a circuit description.

Figure 8:
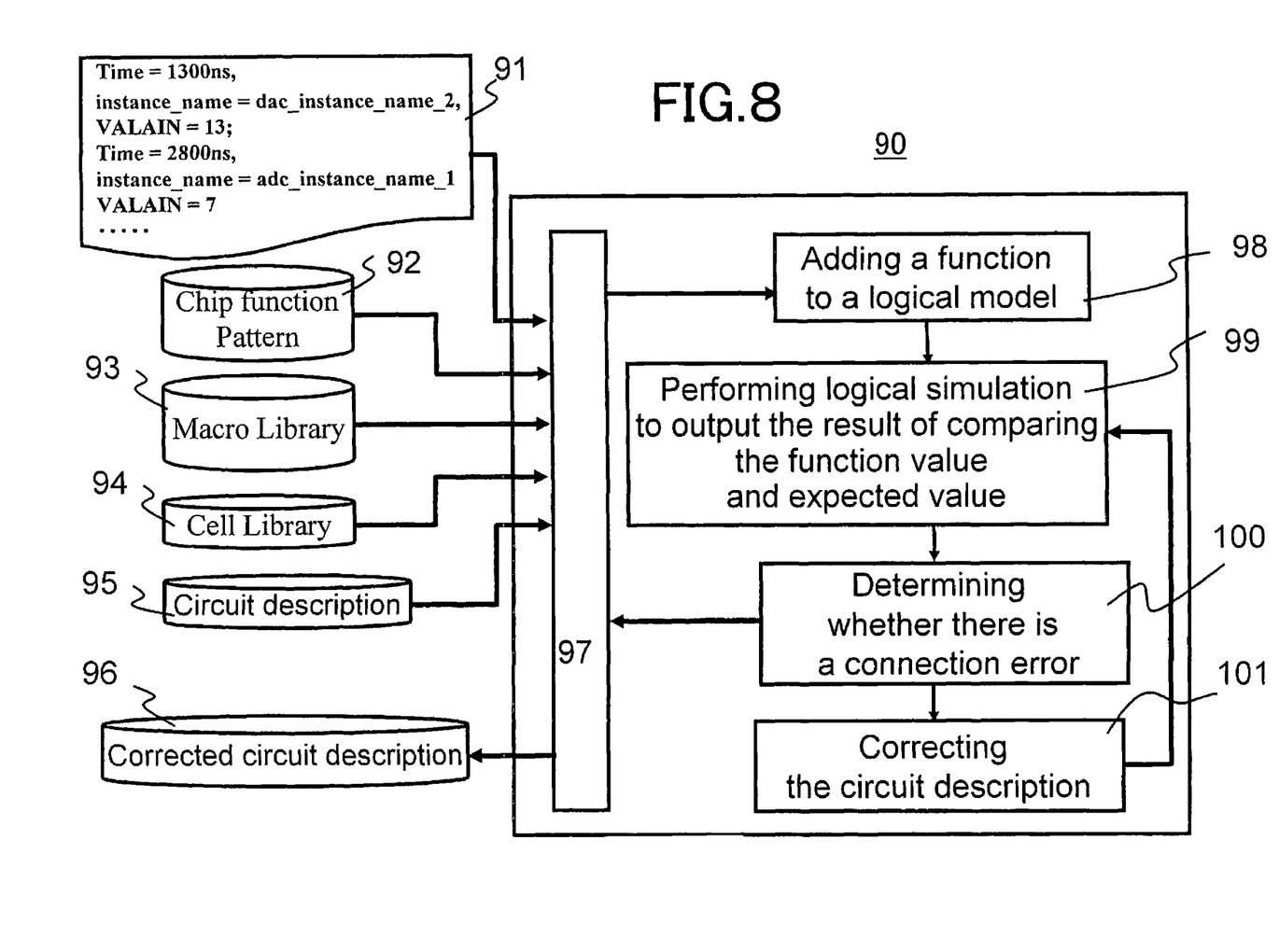
FIG. 8 is a block diagram showing a CAD apparatus for realizing the semiconductor-circuit-device verifying method according to the second embodiment.

FIG. 8 is an illustration of a CAD apparatus 90 for realizing the semiconductor-circuit-device verifying method according, to the second embodiment. FIG. 8 shows the CAD apparatus 90, an input document 91, a chip function pattern 92, a macro library 93, a cell library 94, a circuit description 95, and a corrected circuit description 96. The CAD apparatus 90 includes an input/output means 97, means 98 that adds a function to a logical model, means 99 that outputs the result of comparing a function value and an expected value, means 100 that, based on the result of the comparison, determines whether or not there is a connection error, and a circuit description correcting means 101. The input/output means 97 receives the chip function pattern 92, the macro library 93, the cell library 94, and the circuit description 95, and outputs the corrected circuit description 96. The means 98 that adds the function to the logical model performs an operation similar to that in the step (described with reference to FIGS. 6A to 6C) of adding the function to the logical model. The means 99 that performs the logical simulation to output the result of comparing the function value and the expected value performs an operation similar to that described with reference to FIG. 7. The means 100 that, based on the result of the comparison, determines whether or not there is a connection error performs an operation similar to that in step 4 (FIG. 1) of determining, based on the result of the comparison, whether or not there a connection error. The circuit description correcting means 101 performs an operation similar to that in the circuit description correcting step described with reference to FIGS. 4A and 4B. The input document 91 has content similar to the input items 88 shown in FIG. 7. The chip function pattern 92, the macro library 93, and the cell library 94 are similar to the chip function pattern 84, macro library 85, and macro library 85 shown in FIG. 7, respectively. Accordingly, according to the CAD apparatus 90 in FIG. 8, the semiconductor-circuit-device verifying method according to the second embodiment can be realized.

The semiconductor-circuit-device verifying method according to the second embodiment is a verifying method in which the operation of a semiconductor circuit device including a logic circuit and an analog circuit is verified by inputting, to a logical simulator, a logical model representing the logic circuit and a logical model representing the analog circuit, and which includes the steps of adding a function that generates the logical value of an output signal to be output to the logic circuit through an output terminal, performing logical simulation to output the result of comparing an integer value output from the function and an expected value, and, based on the result of the comparison, determining whether or not there is a connection error between an input terminal or output terminal of the analog circuit and a terminal of the logic circuit. Therefore, according to the semiconductor-circuit-device verifying method according to the first embodiment, an advantage is obtained in that, by performing logical simulation without performing analog simulation, a connection error between a logic circuit and an analog circuit can be detected.

The semiconductor-circuit-device verifying method according to the second embodiment further includes the step of correcting a circuit description. Therefore, according to the semiconductor-circuit-device verifying method according to the second embodiment, when a connection error occurs between a logic circuit and an analog circuit, by correcting the circuit description, a circuit description having no connection error can be obtained.

In the semiconductor-circuit-device verifying method according to the second embodiment, particularly as an analog circuit, an analog-to-digital-conversion-circuit macro is handled.

In addition, the CAD apparatus for realizing the semiconductor-circuit-device verifying method according to the second embodiment is a CAD apparatus in which the operation of a semiconductor circuit device including a logic circuit and an analog circuit is verified by using a logical model representing the logic circuit and a logical model representing the analog circuit, and which includes means which adds, to the logical model representing the analog circuit, a function that generates an integer value in response to an input signal received from the logic circuit through ah input terminal or an output signal output to the logic circuit through an output terminal, means which performs logical simulation to output the result of comparing the integer value output from the function and an expected value, and means that, based on the result of the comparison, determines whether or not there is a connection error between an input terminal or output terminal of the analog circuit and a terminal of the logic circuit.

Therefore, according to the CAD apparatus according to the second embodiment for realizing the semiconductor-circuit-device verifying method, and an advantage is obtained in that, by performing logical simulation for a semiconductor circuit device, a connection error between a logic circuit and an analog circuit can be detected. In addition, since logical simulation is performed to detect a connection error, the need to generate pseudo pulses is eliminated, so that an additional number of clocks is not needed.

Moreover, the CAD apparatus for realizing the semiconductor-circuit-device verifying method according to the second embodiment further includes a circuit description correcting step. Therefore, according to the CAD apparatus for realizing the semiconductor-circuit-device verifying method according to the second embodiment, when a connection error occurs between a logic circuit and an analog circuit, by correcting a circuit description, a circuit description having no connection error can be obtained.

According to a semiconductor-circuit-device verifying method of the present invention, a connection error between terminals of an analog circuit and terminals of a logical circuit can be detected by a logical simulator, and an advantage is obtained in that, by using an analog simulator, the verification time and cost can be reduced. According to a CAD apparatus of the present invention, a connection error between terminals of an analog circuit and terminals of a logical circuit can be detected by a logical simulator, and an advantage is obtained in that, by using an analog simulator, the verification time and cost can be reduced.

What is claimed is:

1. A verifying method to verify operation of a semiconductor circuit device, including a logic circuit, and an analog circuit by inputting a first logical model representing the logic circuit and a second logical model representing the analog circuit to a logical simulator, comprising:

adding a function description to the second logical model representing the analog circuit, the function description representing a function generating a first value in accordance with a state of connection between terminals of the analog circuit and terminals of the logic circuit;

performing a logical simulation outputting a result of comparing the first value generated by the function, and a second value which is expected to be generated by the function if there is no error in the state of connection between the terminals of the analog circuit and the terminals of the logic circuit; and determining whether or not there is an error in the state of connection between the terminals of the analog circuit and the terminals of the logic circuit based on the result.

2. The verifying method as claimed in claim 1, wherein the analog circuit is a digital-to-analog-conversion-circuit, and the function generates an integer value in response to an input signal received from the logic circuit through an input terminal.

3. The verifying method as claimed in claim 1, wherein:

the analog circuit is an analog-to-digital conversion circuit, and the function generates a logical value of an output signal being output to the logic circuit.

4. The verifying method as claimed in claim 1, further comprising:

correcting a circuit description of the semiconductor circuit device.

5. An apparatus verifying operation of semiconductor circuit device by using a first logical model representing a logic circuit and a second logical model representing an analog circuit, the apparatus comprising:

an adder adding a function description to the second logical model representing the analog circuit, the function description being a function generating a first value in accordance with a state of connection between terminals of the analog circuit and terminals of the logic circuit a simulator performing a logical simulation outputting a result of comparing the first value generated by the function and a second value, which is expected to be generated by the function if there is no error in the state of connection between terminals of analog circuit and terminals of the logic circuit; and a determiner determining whether or not there is an error in the state of connection between the terminals of the analog circuit and the terminals of the logic circuit, based on the result.

6. The apparatus as claimed in claim 5, wherein:

the analog circuit is an analog-to-digital conversion circuit; and the function generates a logical value of an output signal being output to the logic circuit.

7. The apparatus as claimed in claim 5, further comprising:

a corrector correcting a circuit description of the semiconductor circuit device.

8. The apparatus as claimed in claim 5, wherein:

the analog circuit is a digital-to-analog conversion circuit, and the function generates an integer value in response to an input signal received from the logic circuit through an input terminal.

* * * * *